United States Patent [19]

Cech et al.

[11] Patent Number: 5,187,119
[45] Date of Patent: Feb. 16, 1993

[54] MULTICHIP MODULE AND INTEGRATED CIRCUIT SUBSTRATES HAVING PLANARIZED PATTERNED SURFACES

[75] Inventors: Jay M. Cech, Bellevue; Andrew F. Burnett, Redmond, both of Wash.

[73] Assignee: The Boeing Company, Seattle, Wash.

[21] Appl. No.: 654,880

[22] Filed: Feb. 11, 1991

[51] Int. Cl.$^5$ ............................................. H01L 21/44
[52] U.S. Cl. ................................ 437/187; 437/189; 437/195; 437/228
[58] Field of Search ............... 437/187, 189, 195, 228

[56] References Cited

U.S. PATENT DOCUMENTS

| | | | |
|---|---|---|---|
| 4,584,761 | 4/1986 | Wu | 437/187 |
| 4,617,193 | 10/1986 | Wu | 427/38 |
| 4,952,275 | 8/1991 | Lin et al. | 156/252 |
| 4,962,061 | 10/1990 | Takata | 437/195 |
| 5,055,425 | 10/1991 | Leibovitz et al. | 437/189 |

FOREIGN PATENT DOCUMENTS

| | | | |
|---|---|---|---|
| 57-145340 | 9/1982 | Japan | 437/195 |
| 61-140134 | 6/1986 | Japan | 437/187 |
| 63-215056 | 9/1988 | Japan | 437/187 |

OTHER PUBLICATIONS

R. J. Jensen et al., "Copper/polyimide materials system for high performance packaging," *IEEE*, pp. 73-81 (1984).

*Primary Examiner*—Brian E. Hearn
*Assistant Examiner*—Laura M. Holtzman
*Attorney, Agent, or Firm*—Christensen, O'Connor, Johnson & Kindness

[57] ABSTRACT

A method of filling features of a substrate to produce a planar patterned surface on said substrate is disclosed. The method includes the steps of: providing a substrate containing a pattern of features defined by a dielectric material; depositing thereon a layer of a conductor, whereby first portions of the conductive layer cover the dielectric material, second portions of the conductor layer fill the features, and third sidewall portions of the conductive layer connect the first and second portions; coating the substrate with a resist and patterning the resist with a resist pattern similar to said pattern of features; etching away all portions of the conductor layer, except the second portions filling the features, by etching under conditions such that lateral etching of the sidewall portions of the conductor layer is inhibited; and stripping the resist to result in a substrate having a substantially planar patterned surface. Planarized multichip modules and integrated circuits are also disclosed.

17 Claims, 8 Drawing Sheets

MULTICHIP MODULE AND INTEGRATED CIRCUIT SUBSTRATES HAVING PLANARIZED PATTERNED SURFACES

FIELD OF THE INVENTION

The present invention relates to multichip module and integrated circuit substrates having planarized surfaces, multilayer interconnect structures based thereon, and methods for their preparation.

BACKGROUND OF THE INVENTION

In the field of high density interconnect technology, many integrated circuit chips are physically and electrically connected to a single substrate commonly referred to as a multichip module (MCM). To achieve a high wiring and packing density, it is necessary to fabricate a multilayer structure on the substrate to connect integrated circuits to one another. Typically, metal power and ground planes in the substrate are separated by layers of a dielectric such as a polyimide. Embedded in other dielectric layers are metal conductor lines (in the range of about 8 to 25$\mu$ wide) with vias (holes) providing electrical connections between signal lines or to the metal power and ground planes. Adjacent layers are ordinarily formed so that the primary signal propagation directions are orthogonal to each other. Since the conductor features are typically narrow in width and thick in a vertical direction (in the range of 5 to 10$\mu$ thick) and must be patterned with microlithography, it is important to produce patterned layers that are substantially flat and smooth (i.e., planar) to serve as the base for the next layer.

If the surface is not flat and smooth, many fabrication problems occur. In a multilayer structure, a flat surface is extremely important to maintain uniform processing parameters from layer to layer. A non-flat surface results in photoresist thickness variations which require pattern or layer dependent processing conditions. The layer dependent processing greatly increases the process complexity and leads to line width variation and reduced yield. Thus, in fabricating multilayer structures, maintaining a flat surface after fabricating each layer allows uniform layer-to-layer processing.

Many approaches to producing a planar surface have been incorporated into methods of fabricating high density interconnects and integrated circuit chips in the past. In one of the oldest methods of fabricating MCMs, referred to herein as the Honeywell approach, vias are plasma etched into the dielectric and a conductive metal (e.g., copper) is sputtered along the sidewalls. This results in a non-planar via which cannot be stacked up from layer to layer and hence a loss of wiring density. Using the Honeywell approach, conductor lines are made by plating or subtractive etching. The lines and vias are planarized by multiple coatings of polyimide which are used to achieve an acceptable degree of planarization. Application of multiple coatings and thick polyimide is time-consuming and creates high stress on the substrate.

In another method, disclosed in U.S. Pat. No. 4,705,606, a via or trench is formed in the dielectric and filled by selective electroplating. This method has the limitation that all of the lines and vias are required to be connected electrically to the periphery of the wafer to carry the electroplating current. This places impractical design constraints on the circuit. The alternative of electroless plating is slow and selective deposition is difficult to achieve. Additional circuit elements that connect the plating feature at one stage of the process and become insulating after uniform or selective heating, such as disclosed in U.S. Pat. No. 4,661,214, add to the process complexity and do not allow passivation of the sidewalls to the conductor features.

Other prior methods have involved plating up features in photoresist patterns, coating them with a very thick polyimide dielectric, and using mechanical polishing to planarize the composite structure. Problems with such methods include: lack of an endpoint detection method for the polishing, incorporation of polishing grit during the process, scratches, mechanical shear stress from polishing, and grit contamination in a clean room. These problems are serious limitations in any practical implementation of such a process.

Integrated circuits, which are fabricated using inorganic dielectric materials (e.g., $SiO_2$) and much smaller line width dimensions than multichip modules, have used different approaches to produce planar surfaces. These approaches include chemical vapor or spin on deposition of dielectrics. Chemical vapor deposition can leave voids between closely spaced lines and spin deposited dielectrics require multiple complex coatings.

Because of the problems associated with prior attempts to produce planarized surfaces on MCMs and integrated circuit chips, such as those described above, there has remained a need for an effective, rapid, and simple method for planarizing conductors in a dielectric medium.

SUMMARY OF THE INVENTION

Generally, it is an object of the present invention to overcome the drawbacks of the prior art methods of producing planar surfaces on high density interconnects (MCMs) and integrated circuits.

More specifically, one object of the present invention is to provide a method of filling dielectric features on a substrate with a conductor to result in a planarized patterned surface. The method may be repeated to form multilayer high density interconnection substrates. Alternatively, the method may be used to form integrated circuits having planarized surfaces.

It is another object of the present invention to provide integrated circuit chips and MCMs with planarized conductor and dielectric surfaces.

The present invention provides a method of filling dielectric features on a substrate to produce a planar surface, which comprises the steps of:

providing a substrate having a surface containing a pattern of trenches or recessed areas defined in a dielectric material;

depositing a layer of a conductor on the patterned surface, whereby first portions of the layer cover the dielectric material and second portions of the layer fill the features, the first and second portions being connected by thin sidewall portions of the layer;

coating the wafer with a resist and patterning the resist with the same pattern as on the underlying substrate;

etching away the conductor layer under conditions such that lateral etching of the sidewall portion of the conductor layer is inhibited, whereby said second portions of said conductor layer which fill the features are left substantially intact; and stripping the resist to result in a substrate having a substantially planar patterned surface.

The present invention also provides integrated circuit chips having planarized patterned surfaces, which are prepared by the method described above.

The invention further provides multilayer interconnect structures, which comprise a plurality of patterned conductor layers having substantially planar surfaces prepared by the above-described method.

The methods of the present invention can also be incorporated into previously known methods to improve planarization of patterned surfaces of circuit chips, as described in greater detail hereinbelow.

DETAILED DESCRIPTION OF THE PREFERRED EMBODIMENTS

FIGS. 1A–1F show in schematic form the various steps that comprise the inventive method of making conductor and dielectric layers having a planarized patterned surface.

Figure 1A:
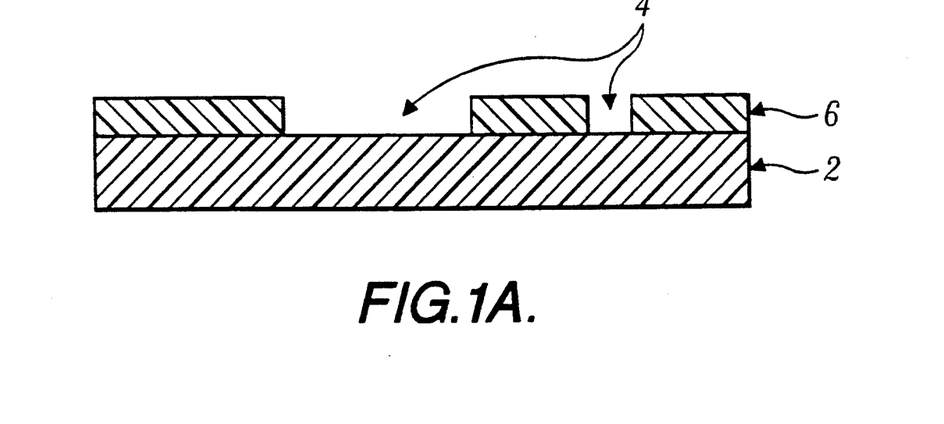
FIGS. 1A–1F show, in cross section, the various steps used to form conductor/dielectric layers for MCMs with planarized patterned surfaces.

FIG. 1A shows a substrate 2 having thereon a pattern of features 4 formed in a layer of dielectric material 6. The substrate 2 may be made up of any material standard in the arts of multichip modules or integrated circuits. A preferred substrate is an oxidized silicon wafer.

The specific nature of the dielectric of the present invention is not critical. Photosensitive polyimides are preferred for high density interconnects; however, non-photosensitive polyimides or inorganic dielectrics (e.g., silicon nitride, silicon dioxide, or glasses) patterned by other means also may be used. Other methods for patterning alternate dielectrics include wet chemical, reactive ion, or laser etching. The unexposed photosensitive polyimides are readily soluble in developing solvents used in the photolithographic patterning art, such as gamma-butyrolactone, cyclopentanone, cyclohexanone, and the like. The resistance of the photosensitive polyimide to dissolution by developing solvents can be greatly increased by irradiating the polyimides with ultraviolet radiation.

Examples of preferred photosensitive polyimides are those commercially available under the trademark PROBIMIDE TM 400 Series from the Ciba-Geigy Corporation. Other examples include PAL, produced by Hitachi Chemicals; PYRALIN TM PD, produced by E.I. DuPont de Nemours and Co.; and PHOTONEECE TM, produced by Toray Industries, and the like.

The polyimide features 4 include vias, trenches and recessed areas. These features can be made by plasma etching or microlithography using a photosensitive polyimide, as described above. Trenches define lines which, when filled with a conductive material, propagate signals in a plane coincident with the plane of the MCM substrate or integrated circuit. Vias are holes which, when filled with a conductive material, interconnect lines on different conductor layers. Recessed areas are any other areas that are desirably filled with a conductive material. The surface of the substrate where these features are exposed or in which they were originally formed is referred to herein as the "patterned surface."

Figure 1B:
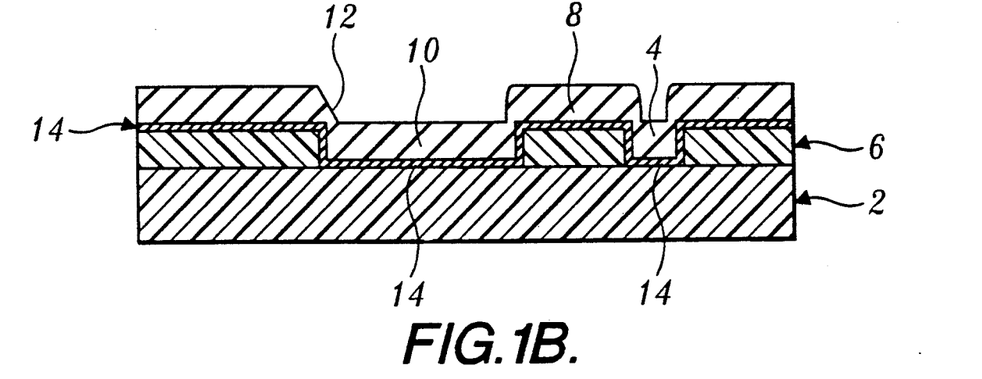

The MCM or integrated circuit chip containing a pattern of features is next covered, at least on its patterned surface, with a layer of conductor material. Referring to FIG. 1B, the features 4 defined in dielectric layer 6 on a surface of substrate 2 are covered with conductor 12. The conductor layer is generally applied by sputter deposition. Evaporation techniques can also be employed, particularly if an ion gun preclean step is used before deposition to promote adhesion. The conductor may be any conductive material known to those skilled in the art; preferably, the conductor is a metal and particularly preferably it is copper.

The features of the patterned surface are filled in by depositing a layer of conductor material having a thickness approximately equal to the dielectric thickness. The sputter deposition process can be controlled such that the sidewall coverage by the conductor is much less than that of the bottom of the feature (trench or via). The sidewall thickness can be controlled by sputtering parameters, particularly pressure and the substrate orientation relative to the sputter deposition cathode. As can be seen in FIG. 1B, the conductor layer assumes a three-portion structure: first portions 8 lie immediately over the dielectric layers, second portions 10 fill the features, and third portions 12 constitute thin sidewalls.

In a preferred method of the present invention, prior to depositing the layer of conductor on the patterned surface, a thin (e.g., 5–200 nm) adhesion metal layer, preferably chromium or titanium, is typically deposited to ensure good adhesion of the conductor to the substrate. The adhesion metal layer 14 also serves as an inherent passivation for the sides and bottom of the conductor 10 (e.g., copper) features. Passivation has been shown to enhance the corrosion resistance of copper conductors in polyimide, thus producing an interconnect structure with greater reliability.

Figure 1C:
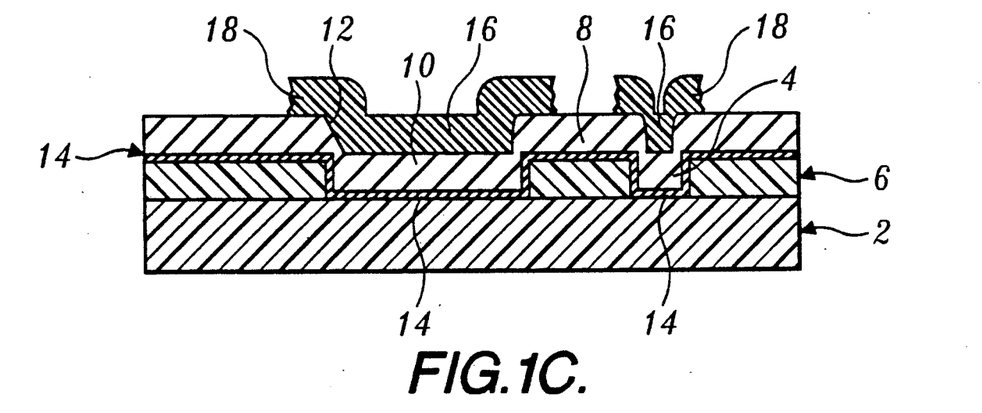

Referring to FIG. 1C, the conductor layer is next coated with a resist material and patterned with a mask pattern similar to the one used to pattern the dielectric material. By "similar" is meant substantially the same or the same mask pattern. Preferably, the resist material is a photoresist. As shown in FIG. 1C, after patterning, the sidewall portions of the conductor layer and the portions of the conductor layer in the features remain covered with resist material 16. The resist material will extend to cover a small portion of the conductor layer over the dielectric. The extension of the resist material takes the form of "wing-like" structures 18, whose size can be controlled by appropriate selection of the photomask dimensions (mask bias).

Figure 1D:
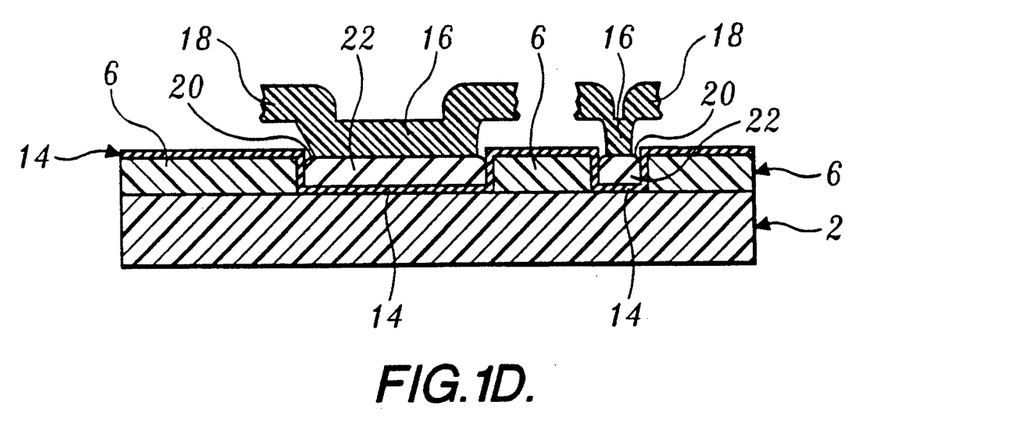

Referring to FIG. 1D, an etching step is next used to remove conductor material from unwanted areas over the dielectric material. The etching step is important to achieve the planar structure of the present invention. It must result in minimal loss of the conductor material 22 that fills the features.

When copper is used as the conductor material 22 filling the feature, it is preferred that an anisotropic copper etchant be utilized. The anisotropic copper etchant is sprayed to remove copper from the unwanted areas above dielectric 6. Simultaneously, the etchant removes copper from under the "wing-like" structure 18 down to the conductor material 22. Anisotropic copper etchants are used in the circuit board industry and are often referred to as "fine-line copper etchants." The vendors of these etchants typically claim that these etchants contain a proprietary surfactant additive or so-called "banking agent," which normally coats the sidewalls of the features being etched (the areas under the wing-like structures 18 in the present invention). This coating inhibits lateral etching of the conductor under the structures 16.

The etching rate decreases substantially at the edge of the conductors 22, for two reasons. First, due to the narrow cross section of the sputtered conductor (copper) along the narrow sidewall region 20, the etchant has to penetrate into a long deep crevice. In this narrow crevice, the etchant is depleted and not replenished quickly, particularly if the etchant is applied by spray action. Second, due to the accumulation of banking agents, the undercutting lateral etch rate is also reduced. Therefore, the etching process slows down or "chokes off" at the edge of region 20. This "choke off" produces an almost planar surface including the upper surface of the dielectric 6 and the upper surface of the conductor 22. There is minimal trenching at the edge of the feature in region 20. This self-limiting characteristic provides an etch endpoint with a large process latitude tolerance to over-etching.

Specific, particularly preferred anisotropic copper etchants are Olin Hunt's Ac-Cu-Fine® and Ac-Cu-Guard® Plus. Ac-Cu-Fine® and Ac-Cu-Guard® Plus are highly buffered alkaline/ammonia-based etchants. Other potentially useful copper etchants are those described or referred to in U.S. Pat. No. 4,952,275.

If aluminum is used as a conductor, it is also possible to use plasma etching to remove the unwanted conductor regions. However, copper is the preferred conductor, as mentioned above, at least in part because it is more conductive than aluminum.

It is also possible to use etchants of other types or those without banking agents. For example, spraying an etchant containing no banking agent onto the surface shown in FIG. 1C may result in the desired structure shown in FIG. 1D, since wing-like structures 18 will at least partially block access by the etchant to conductor in the region 20 shown in FIG. 1D. The etchant will still also become depleted in the "choke off" region 20.

Figure 1E:
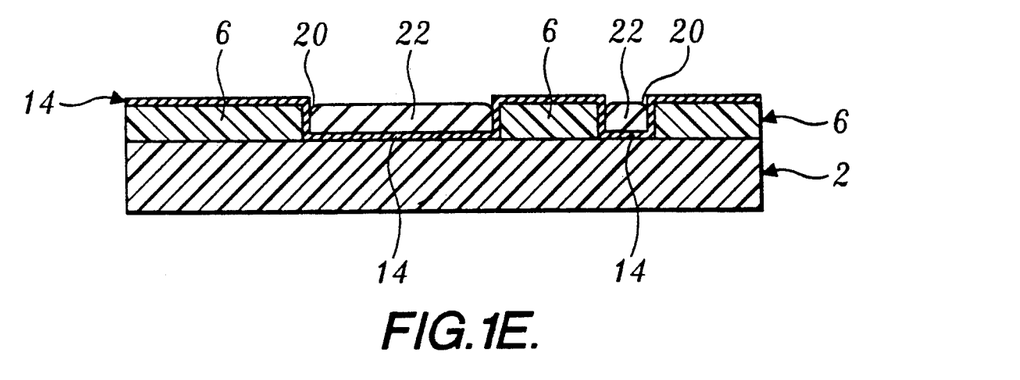

After the above steps, the photoresist material 16, including the wing-like structures 18, is removed by a standard stripping step, to result in the substantially planarized structure shown in FIG. 1E. The copper line 22 has minimal trenching in region 20 based on the "choking off" of etching action, described above.

When an adhesion layer 14 (see FIG. 1B) has been deposited prior to introduction of the conductor layer (8, 10, and 12 in FIG. 1B), the conductor lines 22 (referring to FIG. 1E) may be fully encased in a passivation layer by applying a thin layer of the same adhesion metal 14 to the top of conductor line 22. Thus, an additional thin adhesion metal layer is sputtered onto the substrate and a further resist pattern is defined over the conductor lines to act as an etch mask. Both adhesion metal layers are then etched away simultaneously to finish the fully passivated conductor line shown in FIG. 1F. The encasing adhesion metal layer 26 in FIG. 1F fully passivates the conductor lines and serves to provide adhesion to the next layer of polyimide. As discussed above, the preferred adhesion metal layer is a thin chromium layer.

Figure 3:
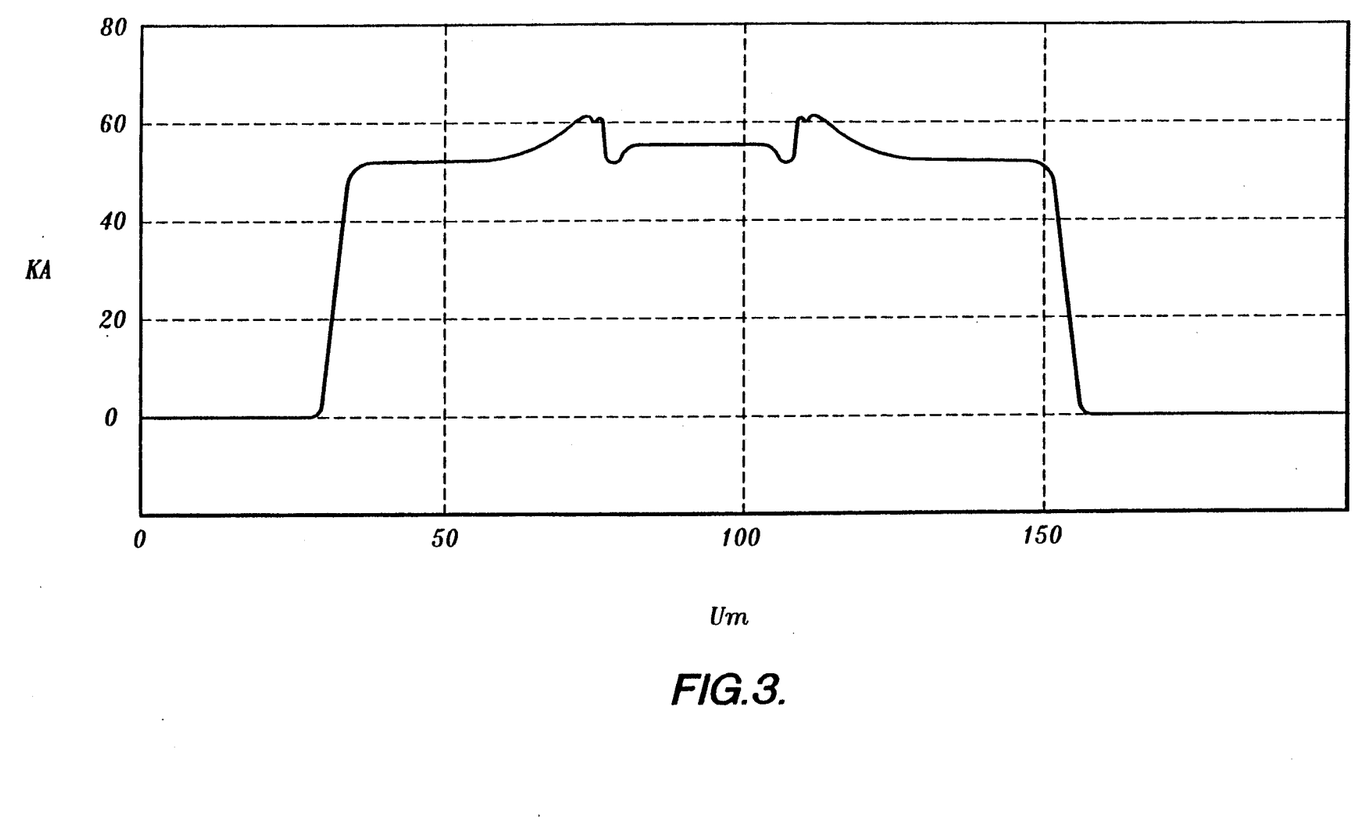
FIG. 3 is a profilometer trace over one of the via structures showing the excellent planarity of the structure and the thickness of the conductor line. The finished line/via structure can be subsequently passivated and planarized with polyimide layers as described herein below.

FIG. 3 is a profilometer trace over one of the via structures showing the excellent planarity of the structure and the thickness of the conductor line.

Figure 1F:
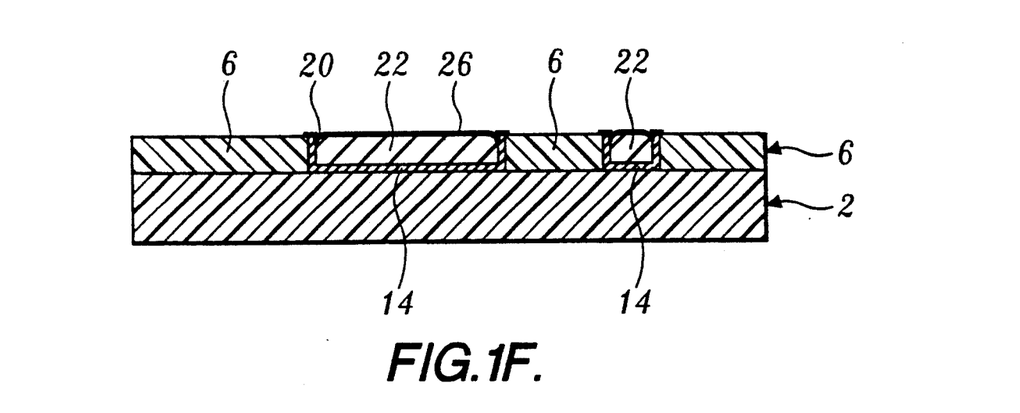
Figure 2:
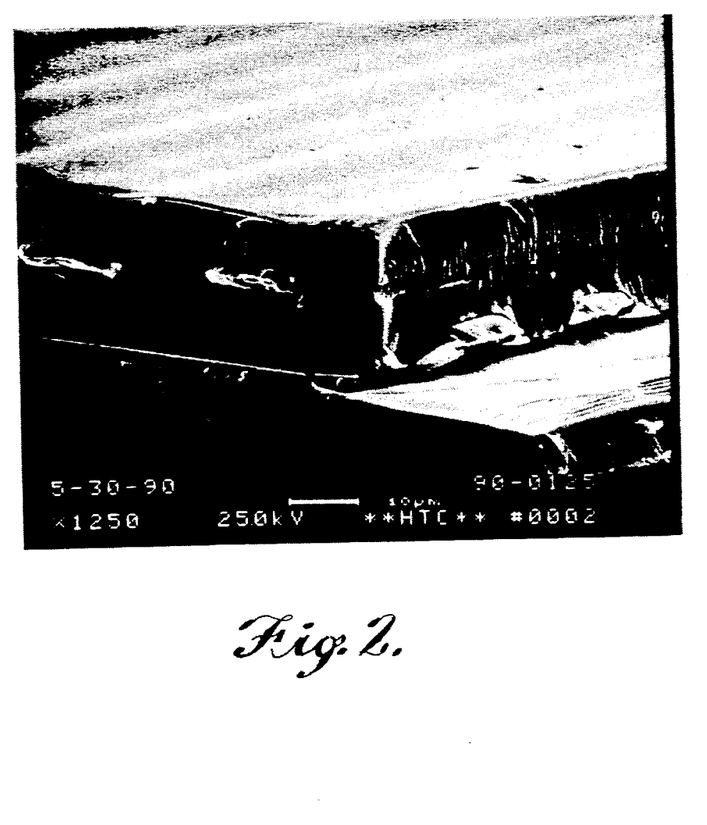
FIG. 2 shows a scanning electron micrograph of multiple finished layers of copper conductor lines in polyimide layers, which are essentially planar.

The sequence of steps shown in FIGS. 1A–1F may be repeated with features formed in a new dielectric layer deposited on the structure shown in FIG. 1F and interated to form an entire multilayer interconnect structure with lines, power planes, ground planes, and interconnecting vias. FIG. 2 shows a scanning electron micrograph showing a finished layer of copper conductor lines in a polyimide layer prepared by such a method, which is essentially planar. The overall process of FIGS. 1A–1F used to produce the structure of FIG. 2 is simple and modular in the sense that the same process sequence (or process module) contains a small number of steps used over and over again to fabricate each layer. After each fabrication process module, a substantially flat surface is formed which serves as a good starting surface for lithography of the next layer. In addition, passivating the lines is very easy in this approach since the bottom and sides are inherently passivated if an adhesion layer is deposited before the conductor layer is deposited. Previous conductor passivation approaches involving the fabrication of lines by either plating or sputtering before dielectric deposition require lithography and etching on a highly corrugated surface with topography height equal to the conductor thickness. This makes lithography difficult and, if the photoresist coverage is not complete on the conductor sidewalls, a site vulnerable to corrosion will be formed where the passivation was unintentionally removed. This can limit the life or effectiveness of the multilayer interconnect structure.

Summarizing the above disclosure, a preferred embodiment of the method steps of the present invention includes the following steps:

(1) providing a substrate of an MCM or integrated circuit made of oxidized silicon coated with a photosensitive polyimide dielectric and forming features in the polyimide by plasma etching or microlithography;

(2) depositing a thin adhesion layer of chromium or titanium on the polyimide and oxidized silicon substrate;

(3) coating the polyimide and silicon substrate with a copper layer by sputter deposition, the copper layer being of a thickness to fill in the vias and trenches;

(4) coating the copper layer with a photoresist using the same mask in the same alignment as that used to form the vias and trenches in the polyimide;

(5) etching away the copper layer outside of the vias and trenches by an anisotropic copper etching method;

(6) removing the photoresist;

(7) passivating the top of the copper features with a chromium or titanium layer, thereby fully encasing the copper feature in an adhesion layer (the sides and bottom of the copper feature are already passivated by the previously deposited adhesion layer);

(8) coating the adhesion metal layer with a photoresist using a similar mask pattern in the same alignment as that used to etch the copper;

(9) etching away the adhesion metal layers outside the photoresist areas; and (10) removing the photoresist.

The methods described above may also be incorporated into prior processes for producing planarized copper conductors and vias. In one specific example, a method wherein a via in the dielectric is formed followed by depositing a conducting plating base on the whole substrate is known. After appropriate etching steps, a trench is opened in the photoresist with one end over the via and extending to where the connecting conductor line will be electroplated. Plating in the via hole occurs simultaneously with plating in the trenches. Because plating in the vias is an isotropic deposition process, plating on the sidewalls of the vias causes different size vias to plate up at different rates. This leads to a non-uniform via height for different size vias such as power vias and smaller signal vias. This method is referred to as "the electroplating method" below.

Also in the electroplating method, there are numerous steps where thick photoresist used to define the plating trenches must be cleared from deep via holes or depressions on the substrate. Due to surface tension and gravity, photoresist tends to accumulate in any trenches or vias on the wafer and, due to its increased thickness at such locations, it is difficult to develop out the resist completely. This is a practical difficulty necessitating frequent inspections or extensive plasma "descumming" steps to ensure the absence of photoresist residue at the bottom of the via holes.

To avoid the above fabrication problems, the method of the present invention described above and illustrated in FIGS. 1A-1F may be used as an improved copper conductor fabrication method to replace the electroplating method described above. A combined via and conductor line structure can be fabricated on a polyimide surface after a via is formed as before by plasma etching or microlithography of photosensitive polyimide similar to that shown in FIG. 1A. The steps in this method are described below.

Figure 4A:
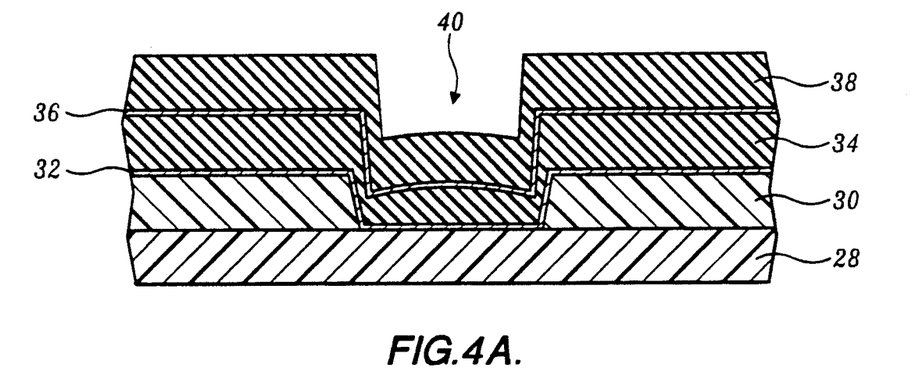
FIGS. 4A–4E show another embodiment of the present invention in which the method of the present invention is designed to replace electroplating in a prior method.

Referring to FIG. 4A, dielectric 30 and via 40 are covered with a four-layer structure, which is sputtered onto the substrate. The four-layer structure is made up of titanium (or chromium) 32, copper 34, titanium or chromium 36, and copper 38. The lowest copper layer 34 is deposited to the desired thickness of the conductor line. The thickness of the upper copper layer 38 is approximately equal to the thickness of dielectric 30.

Figure 4B:
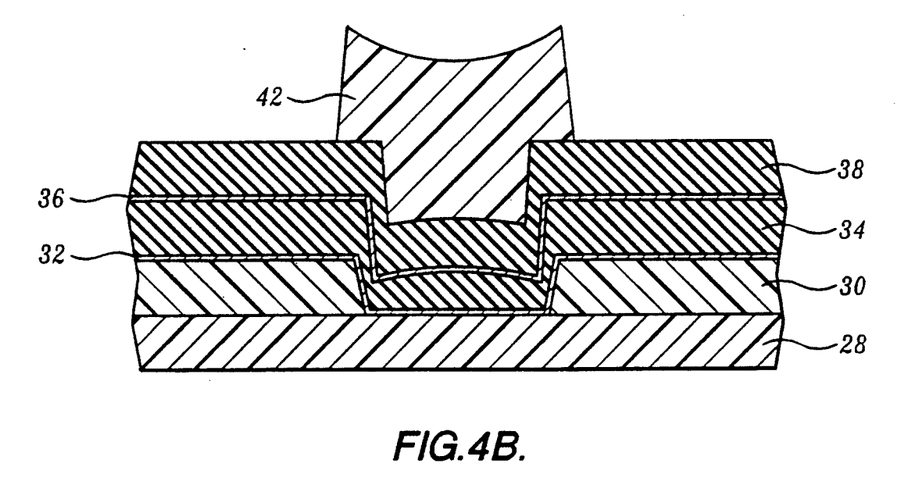

Referring to FIG. 4B, the photoresist is patterned with the mask used to produce the via, leaving a button 42 of resist in and adjacent to the via. The same types of etching techniques described above in conjunction with FIGS. 1A-1F may then be employed to remove the upper copper layer 38.

Figure 4C:
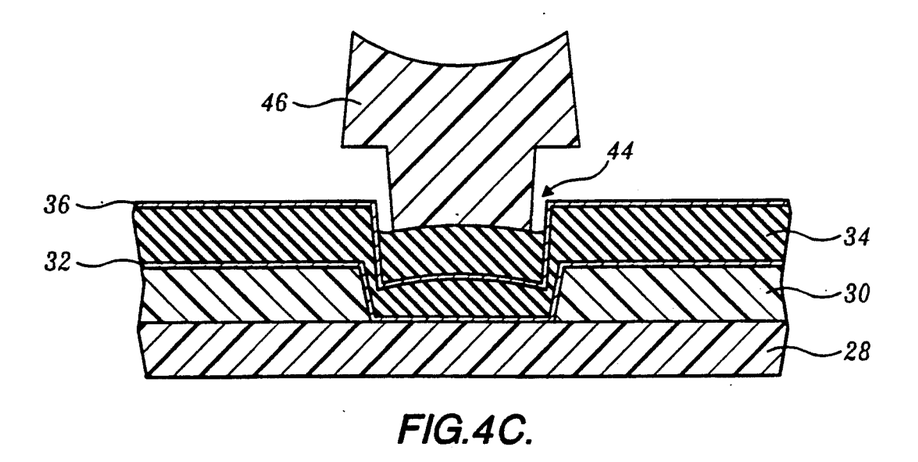
Figure 4D:
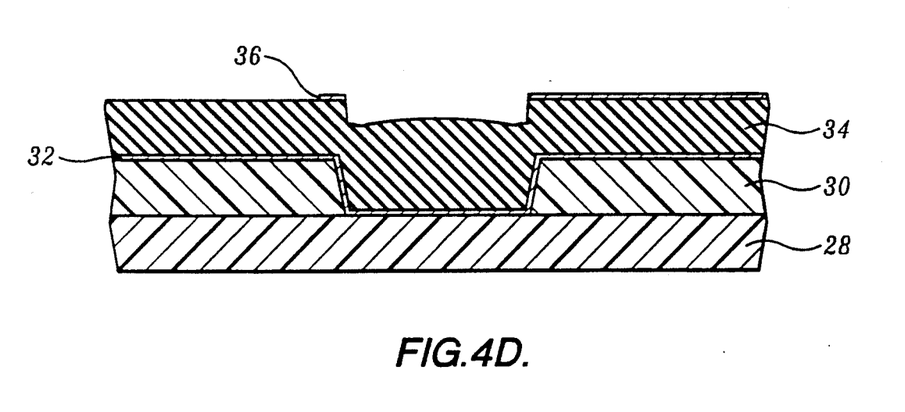
Figure 4E:
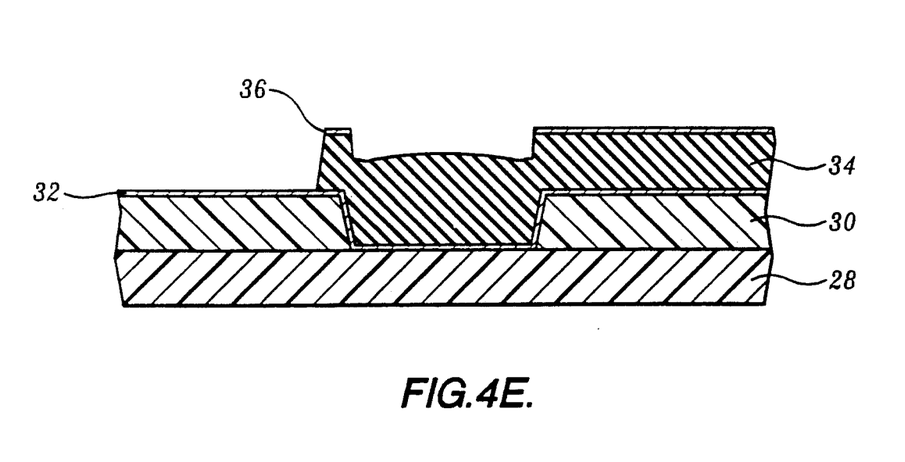

The resulting structure is shown in FIG. 4C. Removal of the upper copper layer by etching stops in the "choke off" region 44. This is due in part to a diminishing etch rate in a lateral etching direction. The etching is limited in the vertical direction by a second layer of chromium or titanium 36 which serves as an etch stop for the copper etchant. The resist 46 is then removed and a second photoresist pattern is formed to serve as an etch mask in the shape of the desired conductor line attached to the via. After an etch of the chromium or titanium etch stop layer 36, the structure shown in FIG. 4D results. The same spray etching is used again to remove the excess copper. When the photoresist is removed, a filled via is finished with the associated line connected to it. This structure has an essentially flat top surface (see FIG. 4E).

Figure 5A:
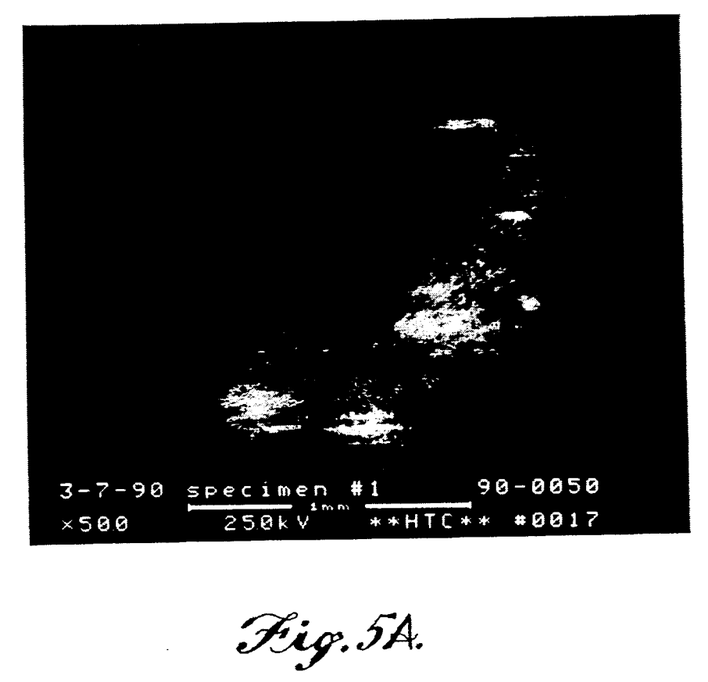
FIG. 5A shows a scanning electron micrograph of a finished filled via hole with a connected copper conductor line and plane over a polyimide layer with 5 μm thick via holes.
Figure 5B:
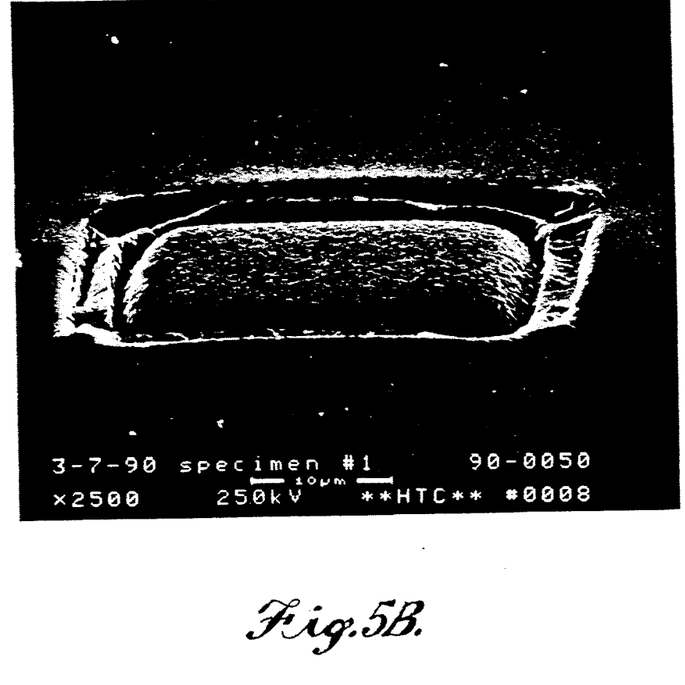
FIG. 5B is a close-up of one of the vias of FIG. 5A showing the high degree of planarity.

FIG. 5A shows a scanning electron micrograph of a finished filled via hole with a connected copper conductor line and plane over a polyimide layer with $5\mu$ thick via holes. FIG. 5B is a close-up of one of these vias showing the high degree of planarity. The finished line/via structure can be subsequently passivated, as discussed above, and further covered with additional polyimide layers, which can be patterned and planarized by the present methods.

This sputtering process, which replaces the plating of vias and lines in the electroplating method offers the advantages of a simpler fabrication process having fewer steps, greater thickness control and uniformity of the conductors and vias when compared to the use of electroplating. The above-described approach has the inherent advantage of leaving the photoresist in the via and the line depressions of the wafer since it is a subtractive approach. This eliminates the difficulties involved with clearing the resist from the deep depressions in additive approaches. Therefore, the extensive plasma "descumming" and inspections are not necessary to ensure complete opening of vias.

While the present invention has been described in relation to various embodiments, including the preferred embodiments and parameters, after reading the foregoing specification, one of ordinary skill in the art will be able to effect various changes, substitutions of equivalents, and other alterations without departing from the broad concepts disclosed herein. It is therefore intended that the scope of Letters Patent granted hereon will be limited only by the definition contained in the appended claims and equivalents thereof.

The embodiments of the invention in which an exclusive property or privilege is claimed are defined as follows:

1. A method of filling dielectric features in a substrate to produce a substantially planar patterned surface on said substrate, comprising the steps of:

provided a substrate having a surface containing a pattern of features defined by a dielectric material;

depositing a conductor layer on the surface of said substrate such that first portions of said conductor layer cover said dielectric material, second portions of said conductor layer fill said features, and said first and second portions are connected by thin sidewall portions of said conductor layer;

coating said conductor layer with a resist and patterning said resist with a resist pattern similar to said pattern of features so that the resulting resist pattern extends over the second portions, sidewall portions, and a part of the first portions adjacent the sidewall portions;

etching away said conductor layer except for said second portions filling said features, under conditions such that lateral etching of said sidewall portions of said conductor layer is inhibited by the resist pattern that extends over a part of the first portions adjacent the sidewall portions; and stripping said resist to produce a substantially planar patterned surface formed of the dielectric material and conductor layer second portions.

2. A method according to claim 1, wherein said features comprise recessed areas, trenches or vias.

3. A method according to claim 1, further comprising, prior to said depositing step, coating said integrated circuit wafer with a layer of an adhesion-promoting and passivating material that binds said conductor and said substrate, and after said stripping step, coating and patterning said planar patterned surface with more of said adhesion-promoting and passivating material, thereby encasing and passivating the conductor layer.

4. A method according to claim 3, wherein said adhesion-promoting and passivating material comprises a member selected from the group consisting of chromium and titanium.

5. A method according to claim 1, wherein said substrate comprises oxidized silicon, said dielectric material comprises a polyimide, and said conductor comprises copper.

6. A method according to claim 1, wherein said features are produced by plasma etching or photolithography of said dielectric material.

7. A method according to claim 1, wherein said conductor is deposited by sputter deposition.

8. A method according to claim 1, wherein said conductor is deposited by evaporation.

9. A method according to claim 1, wherein said conductor comprises copper and said etching is carried out with an anisotropic copper etchant.

10. A method according to claim 9, wherein said anisotropic copper etchant comprises a banking agent.

11. A method according to claim 1, wherein said conductor comprises copper and said etching is carried out by spraying an etchant.

12. A method according to claim 3, further comprising, after said coating and patterning of said planar patterned surface, covering said planar patterned surface with more of said dielectric material, patterning said dielectric material with a circuit pattern of features; carrying out said steps for filling features; and then repeating all of said steps a plurality of times to thereby produce a multilayer interconnect structure.

13. A method according to claim 1, wherein each said second portion of said conductor layer has a thickness equal to the depth of the feature it fills.

14. A method according to claim 1, wherein said conductor material is aluminum and said anisotropic etching is carried out by plasma etching.

15. A method according to claim 14, wherein said plasma etching is reactive ion etching.

16. A method according to claim 1, wherein said dielectric material comprises silicon oxides, silicon nitride or glasses.

17. The method of claim 1, wherein the etching step uses an anisotropic etchant which cooperates with the resist pattern that extends over a part of the first portions adjacent the sidewall portions to inhibit lateral etching of the sidewall portions.

* * * * *